(12) United States Patent
Kausik et al.

(10) Patent No.: US 6,823,374 B2
(45) Date of Patent: Nov. 23, 2004

(54) ADJUSTING THE CACHEABILITY OF WEB DOCUMENTS ACCORDING TO THE RESPONSIVENESS OF ITS CONTENT SERVER

(75) Inventors: Balas Natarajan Kausik, Los Gatos, CA (US); Daren A. Race, Montara, CA (US); Janardhanan Jawahar, San Jose, CA (US)

(73) Assignee: FineGround Networks, Campbell, CA (US)

( * ) Notice: Subject to any disclaimer, the term of this patent is extended or adjusted under 35 U.S.C. 154(b) by 0 days.

(21) Appl. No.: 10/287,364

(22) Filed: Nov. 4, 2002

(65) Prior Publication Data

US 2003/0101231 A1 May 29, 2003

Related U.S. Application Data

(60) Provisional application No. 60/333,800, filed on Nov. 28, 2001.

(51) Int. Cl.[7] .............................................. G06F 15/16
(52) U.S. Cl. ........................ 709/219; 709/217; 711/135
(58) Field of Search ................................ 711/124, 135, 711/165; 709/203, 213, 217, 218, 219

(56) References Cited

U.S. PATENT DOCUMENTS

| | | | |
|---|---|---|---|
| 5,664,106 A | | 9/1997 | Caccavale |
| 5,892,937 A | * | 4/1999 | Caccavale ................... 711/135 |
| 5,907,681 A | * | 5/1999 | Bates et al. .................. 709/228 |
| 6,189,080 B1 | * | 2/2001 | Ofer ............................ 711/167 |
| 6,266,742 B1 | * | 7/2001 | Challenger et al. ......... 711/133 |
| 6,343,065 B1 | | 1/2002 | Serbest |
| 6,351,767 B1 | * | 2/2002 | Batchelder et al. ......... 709/219 |

FOREIGN PATENT DOCUMENTS

JP 02001168921 A * 6/2001 ........... H04L/12/66

OTHER PUBLICATIONS

Oracle9iAS Web Cache, A Technical White Paper, Jun. 2001, Oracle Corporation.

* cited by examiner

Primary Examiner—Wen-Tai Lin
(74) Attorney, Agent, or Firm—Law Offices of Rowana H. Yang

(57) ABSTRACT

We disclose techniques for varying the caching of content provided by a content server as a function of the server's load. When the server is lightly loaded, freshness of the content is maintained. As server load increases, caching time increases, to trade off freshness against transmission time. Similarly, when the server is heavily loaded, users might quickly be served cached content that is only slightly stale—as opposed to content that was fresh at the time of the request, but which becomes materially stale by the time the server completes serving the response. The server's load can be measured by its response time to a request, or otherwise. Optionally, the system can override the load-based caching by defining classes of requests that automatically trigger updating or refreshing (e.g., cache expiration) of related information in the cache.

31 Claims, 5 Drawing Sheets

ADJUSTING THE CACHEABILITY OF WEB DOCUMENTS ACCORDING TO THE RESPONSIVENESS OF ITS CONTENT SERVER

CROSS-REFERENCE TO RELATED APPLICATIONS

This application claims the benefit of U.S. Provisional Application No. 60/333,800, filed Nov. 28, 2001, which is hereby incorporated by reference in its entirety.

FIELD

This patent relates to accelerating the serving of dynamically generated web documents through caching, without significantly compromising freshness of the content.

BACKGROUND

It is commonly required to serve fresh content to web users, for example in the form of web pages that are dynamically generated by formatting the latest information retrieved from a database.[1] Examples of such web pages might include pages of stock quotes, election results and auction prices. While such dynamic delivery offers the user the freshest content, dynamic delivery often exhibits poor performance characteristics under load. When many users visit the web-site at the same time, the server's computational resources can be inadequate to individually generate the page for each user. As a result, users see poor performance, or sometimes no performance owing to server crashes. Some examples of such situations include: (a) an accounting or tax related web site at the close of an accounting period; (b) a news site after the occurrence of a significant news event; and (c) a sports information site during a major sports event.

[1] The terms "content," "web page," "information" and the like should not be restricted to non-functional subject matter, since computer code and other functional subject matter is also often provided by content servers.

In order to improve performance, caches are often installed in tandem with the content server. A cache is a server or other mechanism that stores and reuses content for re-use. By combining a server and a cache, static content that does not change with time can be offloaded to the cache, freeing up the content server to focus primarily on dynamic content.

However, since dynamic content (such as transactional and/or personalized information) changes frequently and across users, it cannot readily be cached and re-used. Thus, in the simplest configuration, dynamic content is not offloaded to the cache. Nevertheless, some system administrators do choose to cache dynamic content by specifying a (relatively short, fixed) time interval so that the content is never out of date by more than the time interval. But it is often infeasible to significantly increase the caching interval (e.g., beyond a few seconds) without significantly compromising freshness (for at least some content). Also, such dynamically cached content is typically out of date by a time equal to the specified time interval, whether or not the content server is experiencing a heavy load. For example, for web sites involved in auctions, the load on the server tends to peak at the close of an auction, with the content also changing frequently during that time period. This is true whether or not the load is nearing the capacity of the system. Thus a simple, fixed caching time interval cannot simultaneously satisfy the competing constraints of heavy loads and rapidly changing content.

Some systems (for example, the 9iAS Web Cache from Oracle) operate by adjusting the caching interval as a function of the number of connections to the content server. However, not all connections make equal demands on the server, and the number of connections is rarely proportional to the ability of the server to respond. For example, even a small number of high demand connections (e.g., downloading multiple files of hundreds of megabytes each, especially over a slow connection) will have a much greater impact than a large number of low demand connections (e.g., checking simple pages with only one changing field). Furthermore, for similar reasons, it is difficult (e.g., for system administrators) to establish, in a meaningful way, a baseline against which to compare a metric such as the number of connections. That is, comparisons based on numbers of connections are likely to be arbitrary rather than truly indicative of the ability of the content server to respond to requests for content.

SUMMARY

Figure 1:
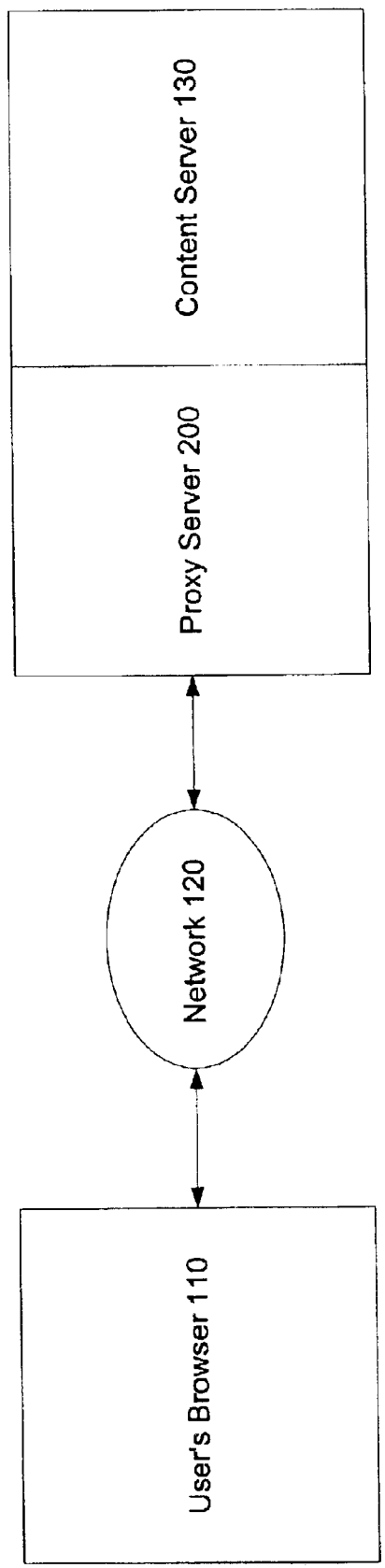
FIG. 1 illustrates an exemplary environment in which the techniques disclosed herein can be implemented as a proxy server.

We disclose techniques for sensing the responsiveness (or load or demand) on the content server, and varying the caching interval accordingly. Thus, when the content server is highly responsive (e.g., because the demands on it are low or its load[2] is light) the caching interval would be low. As the responsiveness of the content server decreases (e.g., because the demands on it are high or its load is heavy), the caching interval can be increased. Thus, when the server is lightly loaded, freshness of the content is maintained; but as the server load increases, the content can be cached for longer periods of time, to trade off freshness against transmission time.

[2] The load should be measured in a manner that will give a meaningful estimate of the (actual or potential) responsiveness of the content server. For example, the number of connections to the content server would not generally be a meaningful predictor of responsiveness.

Similarly, when the content server is heavily loaded, users might quickly be served previously cached content that is, for example, a fraction of second out of date; as opposed to being served nominally "fresh" content from the content server which was entirely fresh at the time of the request, but in fact has become, for example, several seconds out of date by the time the content server finishes serving the response.

In one exemplary embodiment, the content server's load is specified in term of its response time to a request for content. A heavily loaded server is one whose response time exceeds a predetermined threshold (e.g., a desired, or maximum permissible, response time) while a lightly loaded server is one whose response time is less than a desired response time. The response time could be a prior response time, a present response time, or a combination thereof. Of course, other metrics besides response time could also be used to implement caching (and serving) as a function of responsiveness.

We also disclose techniques to permit the system administrator to define "view classes" on the cache, as well as associated "trigger classes." In an exemplary embodiment, a view class includes a set of URLs that may be cached. Correspondingly, a trigger class includes a set of URLs that, when any of its members is accessed, triggers updating or refreshing of the associated view class(es). Thus, the cached copies of a view class expire (and become unusable) when any URL in the associated trigger class is accessed.

The actual content of the URLs comprising the view classes and trigger classes will, of course, depend on the particular environment in which the system is used. For example, in an auction site environment, a trigger class could include those URLs that result in a price bid on an item, while the associated view class could be the set of URLs that report (or otherwise depend on) the current bid price for the item. Thus, when a bid is placed for an item, the previous price (i.e., the prior bid) information expires in the cache, forcing the system to report the latest bid (i.e., from the content server) rather than to reply with a cached copy (i.e., a stale bid).

Of course, view classes and trigger classes need not be limited to URLs, but can as well be constructed using other attributes of web pages (or other forms of documents or objects) appropriate to the operating environment.

In an exemplary embodiment, the proposed system is deployed as a transparent add-on module (e.g., a proxy) between the content server and the user, so that no changes are necessarily required of the content server, the content, the network or the end-user's content browser. However, the system could as well be incorporated in the content server, or otherwise in the network, as appropriate to the particular operational requirements of the network.

DETAILED DESCRIPTION

1. An Exemplary Proxy Server Implementation

FIG. 1 illustrates an exemplary environment including a user browser 110 connected over a network 120 to, and accessing content from, a content server 130. The techniques disclosed herein are generally usable with any networked computer, including wireless networks, handheld devices, and personal computers.

In an exemplary embodiment, the proposed system is deployed as a transparent proxy server 200 located on the network 120 in front of the content server 130. When the user 110 requests content from the content server 130, the request is first received by the proxy server 200, processed at the proxy server, and then sent to the content server 130. The proxy server 200 and/or content server 130 provide a response, which is processed and then returned to the user.

Figure 2:
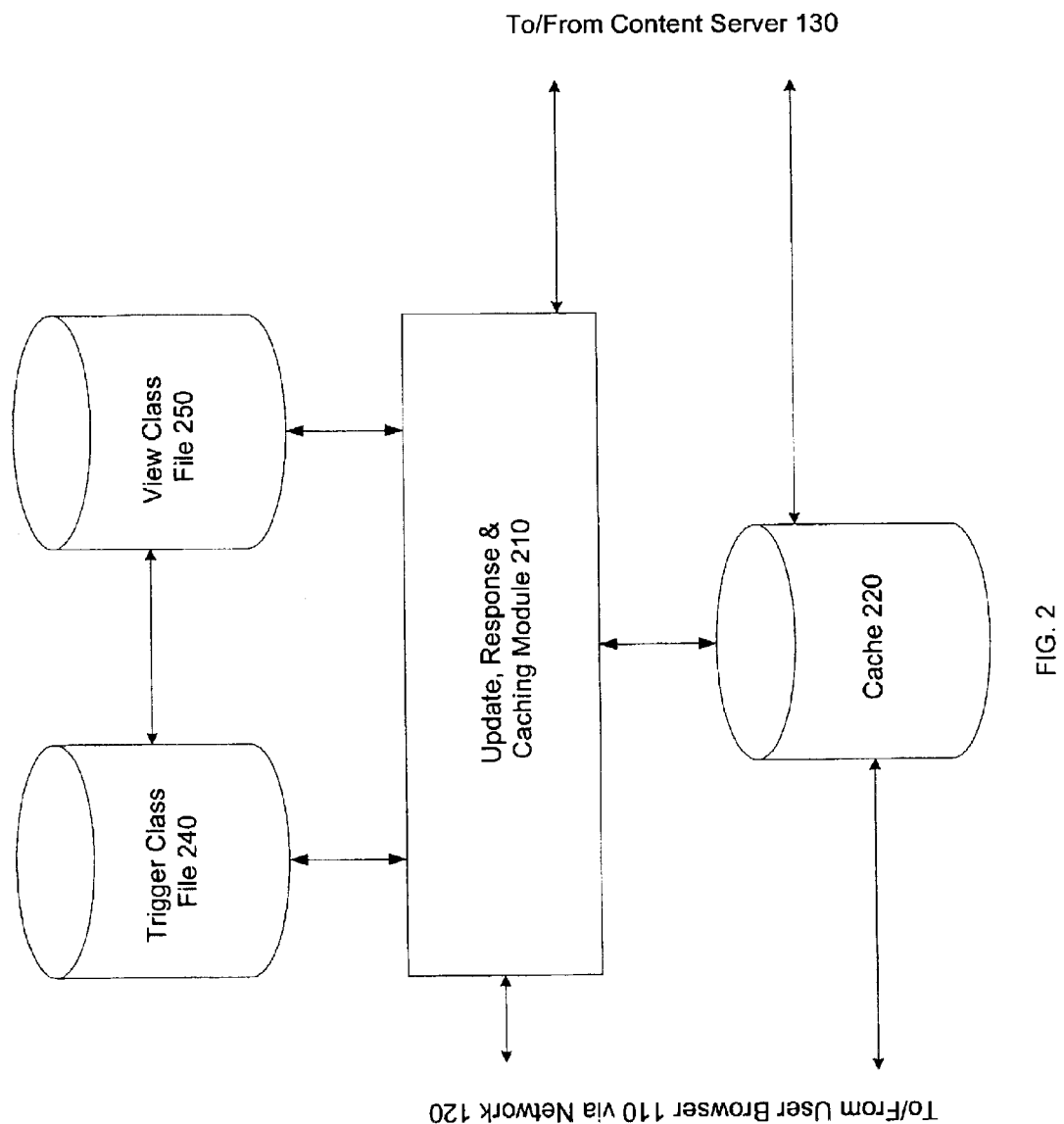
FIG. 2 illustrates an exemplary proxy server.

FIG. 2 illustrates an exemplary overview of proxy server 200 in schematic form. The proxy server may be a stand-alone server, or it may be an integral part of content server 130. If implemented as a stand-alone front end, the proxy server 200 can be deployed in a transparent manner, avoiding the necessity of making changes to already deployed content servers, content, networks and/or browsers.

In an exemplary embodiment, the functionality of proxy server 200 is deployed in updating, response, and caching module or subsystem 210, which communicates with user browser 110 and content server 130. Module 210 (and other system components) may be implemented in an operating environment comprising software installed on a computer, in hardware, or in a combination of software and hardware. The software and/or hardware would typically include some type of computer-readable media which can store data and logic instructions that are accessible by the computer or the processing logic within the hardware. Such media might include, without limitation, hard disks, floppy discs, CDs, digital video discs, magnetic cassettes, tape cartridges, flash memory cards, random access memories (RAMs), read only memories (ROMs), and the like.

Module 210 is in communication with a cache 220, a "trigger class" file 240 and an "view class" file 250. The system administrator specifies a list of URLs that may be cached in view class file 250. He may also specify the maximum time in seconds for which each such URL may be cached, and a desired response time for serving such URLs by the content server. The operation of module 210, and its various subcomponents, will be described in greater detail below with respect to FIGS. 3, 4 and 5.

Figure 3:
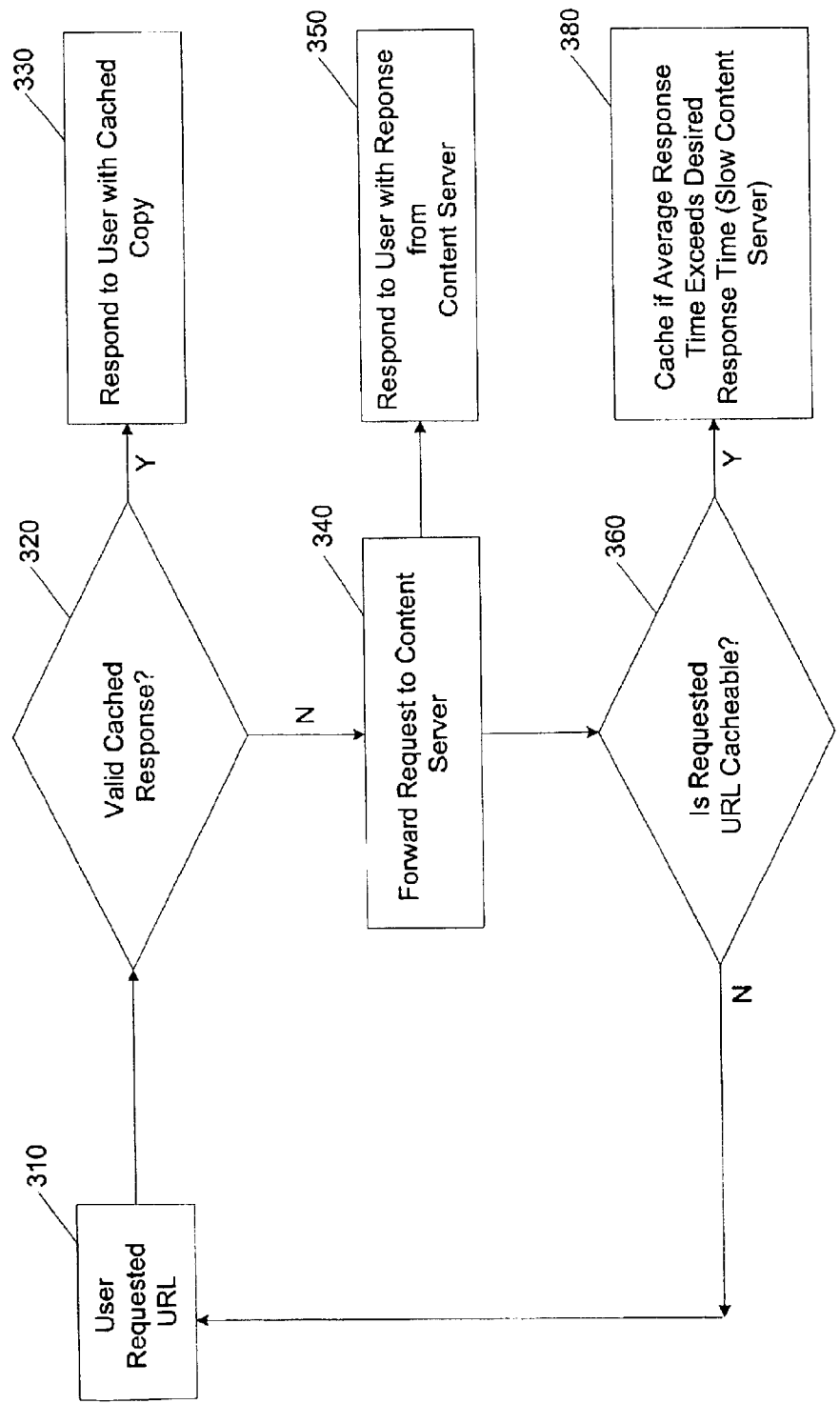
FIG. 3 illustrates an exemplary process for operating the exemplary proxy server of FIG. 2.

FIG. 3 schematically illustrates operation of an exemplary embodiment in greater detail. At step 310, the proxy server 200 receives (e.g., intercepts) a request for a URL. At step 320, the proxy server 200 checks to see whether a valid response for the URL is in cache 220. If so, at step 330, the proxy responds with the cached copy. If not, at step 340, the proxy forwards the user's request to the content server 130. The content server responds with the requested URL, which is returned to the user at step 350.

At step 360, the proxy server checks to see whether the URL is one that may be cached. If the URL cannot be cached, then at step 360 the system returns to step 310 to await the next URL.

If the URL can be cached (e.g., as specified by the system administrator), then at step 380, the proxy server computes the average response time for the content server to respond, and compares the average response time with the desired response time. If the average exceeds the desired response time, the content server is slow (heavily loaded), and the proxy server caches the response for the maximum time permitted for that URL. Conversely, if the if the average is less than the desired response time, the content server is fast (lightly loaded), suggesting that future requests can be quickly served, so the response need not be cached.

2. Another Exemplary Proxy Server Implementation

In the foregoing exemplary embodiment, the response from the content server to the proxy server was first sent to the user, then tested for cacheability. However, this ordering is merely exemplary, rather than mandatory. For example, in another exemplary embodiment, the response could be first tested for cacheability, then forwarded to the user.

Figure 4:
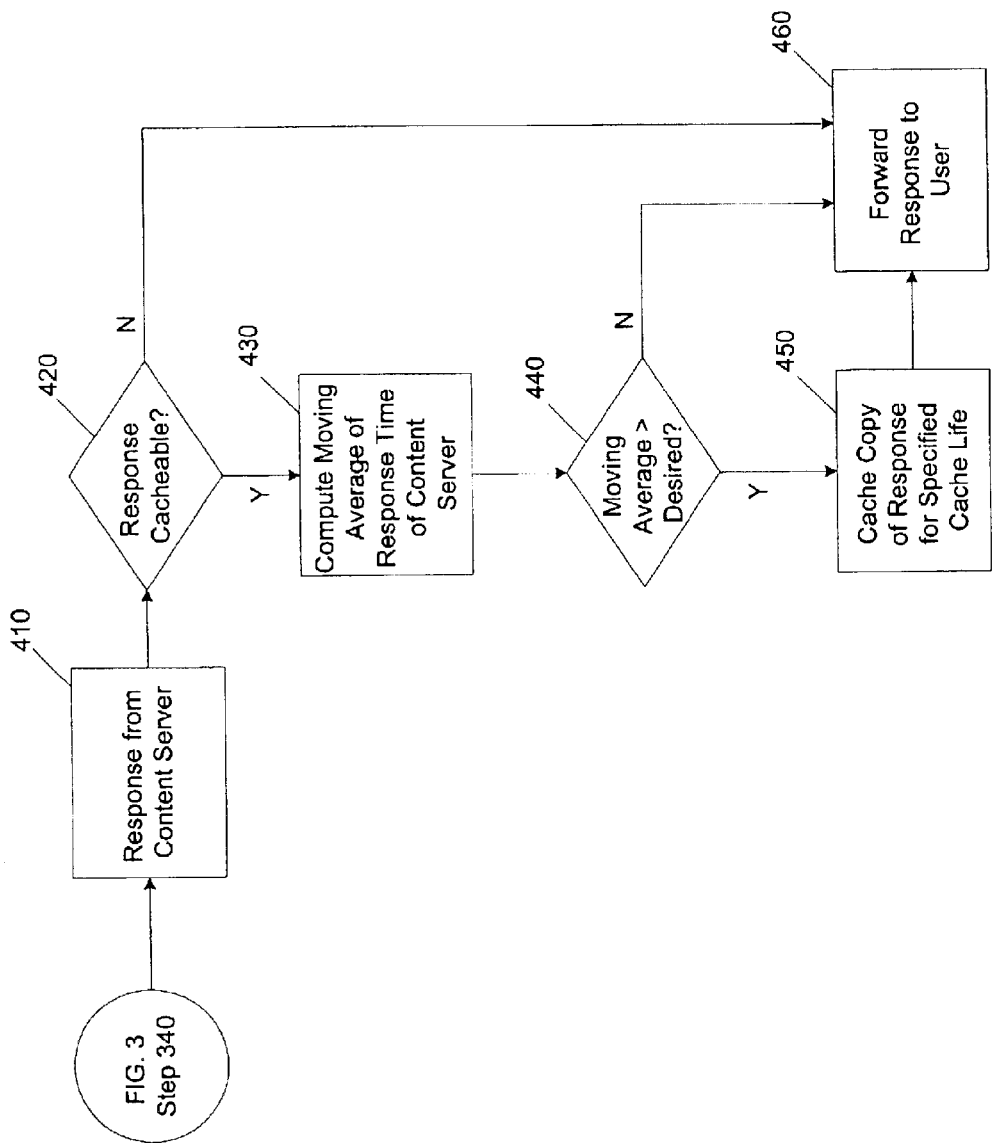
FIG. 4 illustrates another exemplary process for operating the exemplary proxy server of FIG. 2.

FIG. 4 illustrates such an embodiment, shown as an alternative to steps 340 through 380 of FIG. 3. At step 410 (a substitute for step 350), the proxy server obtains the response from the content server. At step 420 (like step 360), the proxy server determines if the URL is cacheable. If not, at step 460, the proxy server simply forwards the response to the user.

If so, at step 430, the proxy server computes the average response time of the content server. At step 440, if the average exceeds the desired response time, the content server is slow (heavily loaded) and, at step 450, the response is cached (for its specified cache life). But if the if the average is less than the desired response time (see step 440), the content server is fast (lightly loaded), suggesting that future requests can be quickly served, so the response is not cached (or only cached for a relatively short interval). At step 460, the response is simply forwarded to the user.

3. Trigger Classes for Expiration and Refreshing a Cache

In some cases, content server responsiveness is not the only determinant of when a response should be cached. For example, suppose that the URLs in question are for an auction site, and the responses from the content server report (or otherwise depend on) the current bid price for the item.

In that scenario, each time someone places a new bid for the item, the current bid price changes. Thus, it would be inappropriate to serve a cached URL, containing a stale bid price, after the bid price has been updated. Regardless of how heavily loaded the content server is, the proxy server should obtain a new response from the content server rather than serving an old response from the cache. In other words, the purely load-based cache usage determination, described above, should be selectively overridden based on inputs that invalidate cached responses. In addition, all existing cached quantities related to the bid price should be expired.

In an exemplary embodiment, such overriding is implemented using the concept of "view classes" and "trigger classes." A view class includes a set of URLs that may be cached. The trigger class file may also include names of any associated trigger class(es), specified cache lives (or intervals), and/or desired response times. A trigger class includes a set of one or more URLs on which the URL(s) in an associated view class depend. When any member of a trigger class is accessed, the request should be served from the content server rather than from the stale cache. Further, the URL(s) in the associated view class(es) should be updated or refreshed in the cache. That is, previously cached copies of a view class should expire when any URL in the associated trigger class is accessed. In an exemplary aspect, the view classes and trigger classes may be specified by the system administrator (or otherwise).

The actual content of the URLs comprising the view classes and trigger classes will, of course, depend on the particular environment in which the system is used. Indeed, view classes and trigger classes need not be limited to URLs, but can as well be constructed using other attributes of documents (or other networked objects) appropriate to the operating environment.

Figure 5:
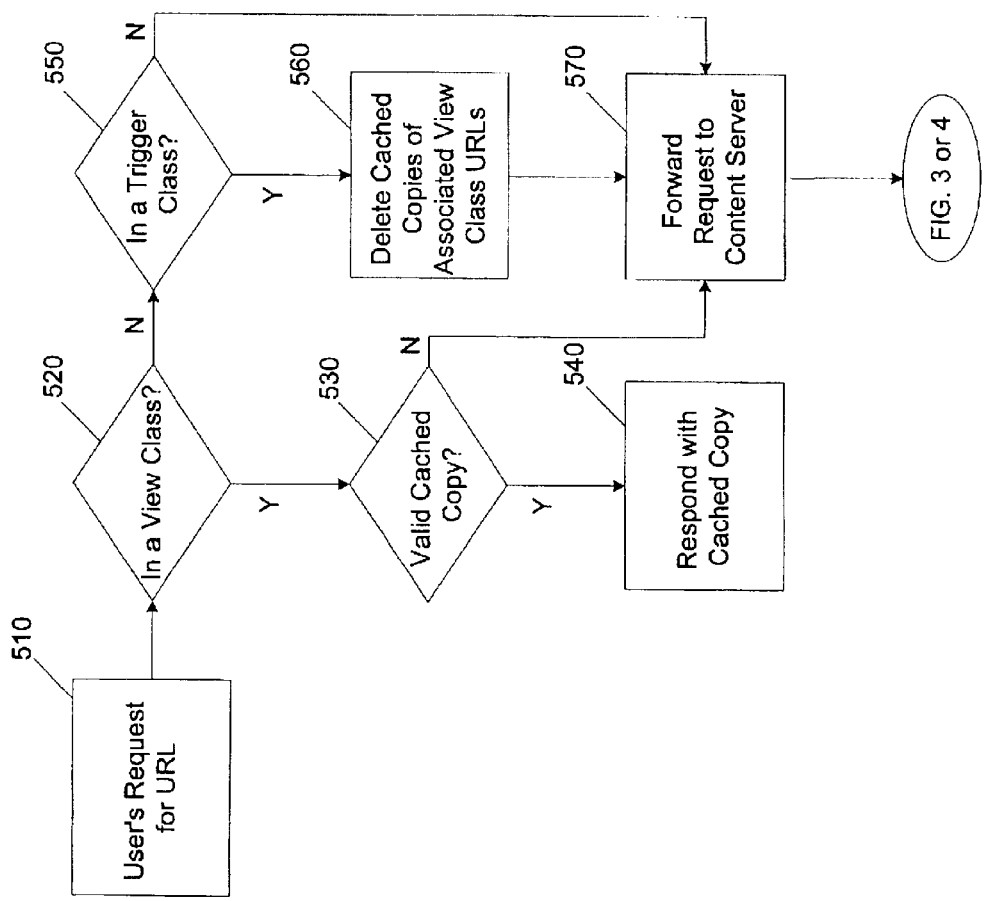
FIG. 5 illustrates another exemplary process for operating the exemplary proxy server of FIG. 2.

FIG. 5 illustrates an exemplary embodiment incorporating view classes and trigger classes. At step 510, the proxy server receives a user-requested URL. At step 520, the proxy server determines if the requested URL is cacheable (i.e., a member of a view class). If so, at step 530, the proxy server determines if the cache contains a valid copy of the requested URL. If so, at step 540, the proxy server responds with the cached copy. Otherwise, at step 570, the proxy server forwards the request to the content server.

Returning to step 520, if the requested URL is not cacheable (i.e., not a member of a view class), the proxy server determines if the requested URL is a member of a trigger class. If not, at step 570, the proxy server forwards the request to the content server.

If so, at step 560, the proxy server deletes any cached copies of the URLs in the associated view class(es). Then, at step 570, the proxy server forwards the request to the content server.

After step 570, the proxy server may continue operation at step 340 of FIG. 3. Alternatively, it may receive the response from the content server, and continue with step 410 of FIG. 4.

4. Other Aspects, Implementations and Embodiments a. Content Server Response Time In sections 1 and 2, the responsiveness of the content server was characterized as an average response time. This average response time might be computed as a moving average in order to smooth out small variations in response time. This average could be taken over the last n requests, the last n minutes, or computed in any other suitable fashion. Further, the weights involved in the moving average may be linear, exponential or otherwise, depending on the relative relevance of the recent history of the performance of the content server in relation to the more distant history of the content server.

Alternatively, the response time of the content server could be characterized as the actual response time for the current request without reference to prior requests. What is used as the content server response time can be a matter of choice for the system implementer and/or the system administrator.

b. Desired Content Server Response Time

In sections 1 and 2, the desired content server response time was specified by the system administrator. Alternatively, the desired response time could be automatically determined based on a statistical measure. There are many possible meaningful statistical measures including, without limitation: (i) the long-term moving average since inception; (ii) the average response time of the content server for the fastest $90^{th}$ percentile of responses; or (iii) the average response time of the content server for the fastest X percentile of responses, where X may be selected by the administrator.

c. Cache Life of URL

In sections 1 and 2, the permissible cache life of the cached copy was specified by the system administrator. Alternatively, the cache life of the cached copy may be automatically selected to be the difference between the moving average of the response time and the desired response time. For example, if the moving average is 5 seconds and the desired response time is 3 seconds, the life of the cached copy is selected to be 2 seconds, as opposed to a predetermined and fixed value.

As yet another alternative, the cache life of the cached copy could begin with an initial value, and grow exponentially up to an optional preset limit, as long as the moving average of the response time exceeds the desired response time. A system using such a configuration would exhibit a graceful degradation of performance under load, thus avoiding collapse of the system.

Still other alternatives provide other techniques for expiring cached copies, such as manual expiry by the system administrator, automated expiry via a script that is triggered by an external event such as a change in database, or message based expiry wherein a remote process may call a subroutine on the proxy to expire cached copies.

d. Other Content Server Performance Metrics

In sections 1 and 2, the responsiveness of the content server was characterized by its response time. In an alternate embodiment, the responsiveness of the content server may be measured as the number of pages served by the content server per unit time, the load on the CPU of the content server, the overall demand being imposed by those users who are active at a given time, or other reasonable means of measuring the responsiveness of the content server as will be recognized by those skilled in the art.

e. Specification of View and Trigger Classes

In specifying view classes and/or trigger classes, the system administrator can specify URLs as fully and uniquely specified, or in the form of a regular expression with wildcards to describe a group of URLs. For example, http://www.fineground.com/products.html is a fully specified URL, while http://www.fineground.com/p*.html describes a group of URLs where the asterisk is a wildcard that may be replaced with any valid character.

f. Tagging

In section 4.e, the system administrator specified classes of URLs as cacheable (i.e., view classes), with optional trigger URLs associated with each class. Alternatively, the system administrator could specify the view and trigger characteristics by embedding this information directly or indirectly into the content, rather than by characterizing the URLs associated with the content.

For example, each web page or web object could be marked with identifying tags. Such tags could, by analogy to the URL classification, act as view tags or trigger tags. In an exemplary implementation, a first set of web pages could include the string <tag tag_name=tag_33; tag_type=view; life=0.3 seconds>, while a second set of web pages could include the string <tag tag_name=tag_33; tag_type= trigger; >. When these pages are processed by the proxy, the outcome will be equivalent to specifying a view class of the first set of pages with a cache life of 0.3 seconds, with an associated trigger class corresponding to the second set of web pages. In a refinement of this embodiment, tags may be specified on subsections of pages, so that a final page may be assembled by combining the freshest cached portions of each section comprising the page.

Alternatively, the view and/or trigger information could be located in an external file referenced by an entry within the web page or object.

g. Cookies

Some content servers place a cookie on a user's computer, and take into account the contents of the cookie when responding to the user's request for content. For example, the request might be for all updated information since the user's last login, the date of which might be recorded in the cookie. To accommodate such cases, a view class and/or an trigger class may include values specifiable by the cookie. As with the URLs in section e, such cookie values could be fully and uniquely specified, or take the form of a regular expression.

5. Conclusion

The foregoing examples illustrate certain exemplary aspects, implementations and embodiments from which various variations and modifications will be apparent to those skilled in the art. The inventions should therefore not be limited to the particular instances discussed above, but rather are defined by the claims.

What is claimed is:

1. A method for varying the cacheability of networked content depending on the responsiveness of a content server, comprising:
   (a) computing a measure of responsiveness of a content server;
   (b) determining a caching interval for a requested item in accordance with said responsiveness, including:
      (i) setting the caching interval lower if an actual level of responsiveness is higher than a responsiveness threshold; and
      (ii) else setting the caching interval higher;
   (c) obtaining said requested item from said content server; and
   (d) specifying a cacheability of said item in accordance with said determined caching interval.

2. The method of claim 1 where:
   (i) said content servers responsiveness is based on an average response time to requests for content; and
   (ii) said responsiveness threshold is based on a desired response time.

3. The method of claim 1 where:
   (i) said content servers responsiveness is based on an actual response time to requests for content; and
   (ii) said responsiveness threshold is based on a desired response time.

4. The method of claim 1 where content server's responsiveness is based on a number of pages served by said content server in a specified time.

5. The method of claim 1 where content server's responsiveness is based on said content server's CPU load.

6. The method of claim 1 where content server's responsiveness is based on an overall demand being imposed by active users of said content server.

7. The method of claim 1 where said caching interval represents a difference between said computed responsiveness and said responsiveness threshold.

8. The method of claim 1 wherein said (c) occurs before said (b).

9. The method of claim 1 where said responsiveness threshold is determined based on a statistical measure of historical requests.

10. The method of claim 1 where said (d) includes caching said item if said computed responsiveness is worse than said responsiveness threshold.

11. The method of claim 1 where said (d) includes not caching said item if said computed responsiveness is better than said responsiveness threshold.

12. The method of claim 1 where said (d) includes not caching said item if an aspect of said requested item would trigger invalidity of said cached item.

13. The method of claim 1 where an aspect of said requested item includes information in an identifier of said item.

14. The method of claim 1 where said aspect of a requested item includes information embedded within said item.

15. The method of claim 1 further comprising, after at least said (b), expiring at least one cached item in response to a determination that information in said requested item would trigger invalidity of an aspect of said cached item.

16. The method of claim 1 implemented at a proxy server between said content server and a user.

17. A method for obtaining networked content from a cache or a content server, depending on the responsiveness of the content server, comprising:
   (a) receiving a users request for an item;
   (b) computing a measure of responsiveness of a content server;
   (c) obtaining said requested item:
      (i) from said content server if said computed responsiveness is higher than a responsiveness threshold; else
      (ii) from a cache containing a previously cached version of said item;
      (iii) setting a caching interval lower if an actual level of responsiveness is higher than a responsiveness threshold.

18. The method of claim 17 where said request triggers invalidation of at least some of the cached items in the cache.

19. The method of claim 17 where said (c) includes extending a cache life of said previously cached version while said computed responsiveness is higher than a responsiveness threshold.

20. A method for obtaining networked content from a cache or a content server, depending on the responsiveness of the content server, comprising:
   (a) receiving a user request for an item available at a content server;
   (b) determining whether said user request will trigger invalidity of a previously cached item;
   (c) deleting from a cache all items determined to be invalid as in (b);
      (i) setting a caching interval lower if an actual level of responsiveness is higher than a responsiveness threshold.

21. A computer-readable medium comprising logic instructions for varying the cacheability of networked content depending on the responsiveness of a content server, said instructions when executed on a computer:

(a) computing a measure of responsiveness of a content server;

(b) determining a caching interval for a requested item in accordance with said responsiveness, including:
   (i) setting the caching interval lower if an actual level of responsiveness is higher than a responsiveness threshold; else
   (ii) setting the caching interval higher;

(c) obtaining said requested item from said content server; and (d) specifying a cacheability of said item in accordance with said determined caching interval.

22. The computer-readable medium of claim 21 where said caching interval represents a difference between said computed responsiveness and said responsiveness threshold.

23. The computer-readable medium of claim 21 where said (d) includes caching said item if said computed responsiveness is worse than said responsiveness threshold.

24. The computer-readable medium of claim 21 where said (d) includes not caching said item if said computed responsiveness is better than said responsiveness threshold.

25. The computer-readable medium of claim 21 where said (d) includes not caching said item if an aspect of said requested item would trigger invalidity of said cached item.

26. The computer-readable medium of claim 21 further comprising logic instructions for expiring at least one cached item in response to a determination that information in said requested item would trigger invalidity of an aspect of said cached item.

27. The computer-readable medium of claim 21 implemented at a proxy server between said content server and a user.

28. A device for varying the cacheability of networked content depending on the responsiveness of a content server, comprising:

(a) means for computing a measure of responsiveness of a content server;

(b) means for determining a caching interval for a requested item if said computed measure of responsiveness is higher than a responsiveness threshold and else setting the caching interval higher;

(c) an interface for obtaining said requested item from said content server; and (d) means for specifying a cacheability of said item in accordance with said determined caching interval.

29. A proxy server for varying the cacheability of networked content depending on the responsiveness of a content server, comprising:

(a) an interface to a content server;

(b) computer-executable program logic for determining a caching interval for a requested item in accordance with a responsiveness of said content server, including:
   (i) setting the caching interval lower an actual level of responsiveness is higher than a responsiveness threshold; and
   (ii) setting the caching interval higher if an actual level of responsiveness is higher than said responsiveness threshold; and (c) computer-executable program logic for specifying a cacheability of said item in accordance with said determined caching interval.

30. The proxy server of claim 29 where said (d) includes not caching said item if an aspect of said requested item would trigger invalidity of said cached item.

31. The proxy server of claim 29 further comprising computer-executable program logic for expiring at least one cached item in response to a determination that information in said requested item would trigger invalidity of an aspect of said cached item.

* * * * *